US009466863B2

(12) United States Patent
Hong et al.

(10) Patent No.: US 9,466,863 B2
(45) Date of Patent: Oct. 11, 2016

(54) SUBSTRATE FOR SENSING BATTERY CELL

(75) Inventors: Hyo Jin Hong, Daejeon (KR); Seung Bum Kim, Suwon-si (KR); Eun Jeong Choi, Ulsan (KR); Won Jun Lee, Daejeon (KR)

(73) Assignee: SK INNOVATION CO., LTD. (KR)

( * ) Notice: Subject to any disclaimer, the term of this patent is extended or adjusted under 35 U.S.C. 154(b) by 409 days.

(21) Appl. No.: 14/112,326

(22) PCT Filed: Apr. 20, 2012

(86) PCT No.: PCT/KR2012/003045
§ 371 (c)(1),
(2), (4) Date: Oct. 17, 2013

(87) PCT Pub. No.: WO2012/144844
PCT Pub. Date: Oct. 26, 2012

(65) Prior Publication Data
US 2014/0247858 A1 Sep. 4, 2014

(30) Foreign Application Priority Data

Apr. 20, 2011 (KR) ........................ 10-2011-0036793

(51) Int. Cl.
*G01K 1/08* (2006.01)
*H02J 7/14* (2006.01)
*H01M 10/48* (2006.01)
*G01R 31/36* (2006.01)

(52) U.S. Cl.
CPC ........... *H01M 10/486* (2013.01); *H01M 10/48* (2013.01); *G01R 31/3641* (2013.01)

(58) Field of Classification Search
USPC .................................. 320/107, 116; 374/142
See application file for complete search history.

(56) References Cited

U.S. PATENT DOCUMENTS

| 7,892,669 B2 | 2/2011 | Yang et al. | |
|---|---|---|---|
| 2007/0139004 A1* | 6/2007 | Satsuma | H02J 7/0045 320/114 |
| 2009/0108812 A1 | 4/2009 | Lee | |
| 2009/0323293 A1* | 12/2009 | Koetting | H01M 10/425 361/736 |
| 2010/0124693 A1* | 5/2010 | Kosugi | G01R 31/3644 429/92 |

FOREIGN PATENT DOCUMENTS

| JP | 2009163932 | 7/2009 |
|---|---|---|
| JP | 2010123299 | 6/2010 |
| KR | 1020070112489 | 11/2007 |
| KR | 1020090043712 | 5/2009 |

OTHER PUBLICATIONS

International Search Report—PCT/KR2012/003045 dated Dec. 3, 2012.

* cited by examiner

*Primary Examiner* — Lisa Caputo
*Assistant Examiner* — Nasir U Ahmed
(74) *Attorney, Agent, or Firm* — Cantor Colburn LLP

(57) ABSTRACT

Provided is a substrate for sensing voltage and temperature of battery cells, and more particularly, a substrate for sensing battery cells firmly fixed to the battery cells by a clip coupling method and easily detached and attached therefrom.

4 Claims, 3 Drawing Sheets

SUBSTRATE FOR SENSING BATTERY CELL

TECHNICAL FIELD

The present invention relates to a substrate for sensing voltage and temperature of battery cells, and more particularly, to a substrate for sensing battery cells firmly fixed to the battery cells by a clip coupling method and easily detached and attached therefrom.

BACKGROUND ART

In general, a secondary battery means a battery that can be recharged unlike a primary battery that cannot be charged and has been prevalently used in small-sized advanced electronic device fields such as cellular phone, PDA, notebook, computer, or the like. In particular, a lithium secondary battery, which has an operating voltage of 3.6V, has three times more than that of a nickel-cadmium battery or a nickel-hydrogen battery mainly used as a power supply for electronic devices and has high energy density per unit weight. Therefore, the use of the lithium secondary battery has been rapidly increased.

Further, the above-mentioned secondary battery may be classified into an internal type battery and an external type battery based on a method of mounting a secondary battery in electronic devices, wherein the embedded type battery is widely referred to as an inner pack. Therefore, the inner pack is used for the embedded type battery in the description hereinafter.

The external type battery forms a portion of the electronic devices. That is, the external battery is mounted in a state in which one surface thereof is exposed to the electronic devices. Therefore, the external type battery may be mounted and separated in and from the electronic device by the relatively easy working, but the appearance thereof needs to match shapes of the electronic devices. As a result, the external type battery should be manufactured to be individually matched with various types of electronic devices. Therefore, the external type battery has low compatibility and is designed to have various types of designs, which leads to the increase in production cost.

For this reason, the use of the inner pack has been recently increased. Therefore, the inner pack is mounted in the electronic devices and the electronic device in which the inner pack is mounted includes a separate cover covering the mounted inner pack from the outside. Therefore, mounting the inner pack in the electronic device is relatively cumbersome. On the other hand, the inner pack may be compatible with several types of electronic devices and may be simply designed due to the above characteristics. As a result, the inner pack may be advantageous in mass production and production cost thereof can be reduced.

Briefly describing the configuration of the inner pack, the inner pack is configured by stacking pouch type bare cells that are one of the core components of the secondary battery, wherein the inner pack is configured by positioning the bare cells in the cell case and then, stacking the cell cases so as to protect the bare cells and easily fix the bare cells.

In this case, the bare cell generates heat at the time of operating. Therefore, the inner pack is provided with a sensing substrate sensing the temperature and voltage of the bare cell so as to monitor whether the stabilized voltage is generated while preventing overheating of the bare cell.

In the related art, the assembly working is not easily performed due to the direct welding of the sensing substrate to each cell or the welding of the sensing substrate to each cell using the terminals. Further, the welding is not uniform according to the welding strength of the worker, which causes a problem in that the welding strength reference is proposed in mass production, the working process is added, or the like.

DISCLOSURE OF INVENTION

Technical Problem

An object of the present invention is to provide a substrate for sensing battery cells that does not need a welding process by directly inserted a sensing substrate into electrode taps of battery cells.

Another object of the present invention is to provide a substrate for sensing battery cells, in which the battery cells stacked at a multi stage are connected with each other once by using a parallel slot structure.

Still another object of the present invention is to provide a substrate for sensing battery cells in which a temperature sensing bracket for sensing temperature of battery cells is integrally formed.

Solution to Problem

In one general aspect, there is provided a substrate 20 for sensing battery cells to sense voltage and temperature of the battery cells 10 having positive electrodes 11 and negative electrodes 12 exposed to one side of the substrate, wherein the sensing substrate 20 has an opened one side or other side so as to insert each of the positive electrodes 11 and the negative electrodes 12 into a bottom surface thereof and includes slots 21 formed to correspond to a length direction of the positive electrodes 11 and the negative electrodes 12.

The plurality of slots 21 may be formed so as to be spaced apart from each other along a length direction of the sensing substrate 20 and a spaced distance between the slots 21 may correspond to a spaced distance between the battery cells 10 at the time of stacking the battery cells 10.

The slot 21 may include: a first slot 21a formed on one side of a bottom surface of the sensing substrate 20 so as to correspond to the positive electrode 11, a second slot 21b formed on the other side of the bottom surface of the sensing substrate 20 so as to correspond to the negative electrode 12, and the first slot 21a and the second slot 21b are formed to cross each other.

The sensing substrate 20 may include a terminal 22 of which one end is fixed to the sensing substrate 20 and the other end is exposed to a top end of the slot 21, and A bottom surface of the other end of thee terminal 22 may be electrically connected with the positive electrode 11 and the negative electrode 12 by contacting top ends of the positive electrode 11 and the negative electrode 12 when the positive electrode 11 and the negative electrode 12 are inserted into the slots 21.

A bottom surface of the sensing substrate 20 may be integrally provided with a temperature sensor bracket 23 extending downwardly.

Advantageous Effects of Invention

In accordance with the exemplary embodiments of the present invention, the sensing substrate is connected to the cell stacked at the multi stage at a time while simplifying the coupling process of the battery cells and the sensing substrate, thereby saving the costs and time consumed by the manufacturing of the products. Further, the detachment and attachment of the sensing substrate can be easily performed and thus, the exchange of parts can be facilitated. The temperature sensor is integrally mounted in the bracket and thus, is to be easily fixed to the battery cells.

BRIEF DESCRIPTION OF DRAWINGS

The above and other objects, features and advantages of the present invention will become apparent from the following description of preferred embodiments given in conjunction with the accompanying drawings, in which.

DETAILED DESCRIPTION OF MAIN ELEMENTS

Figure 1:
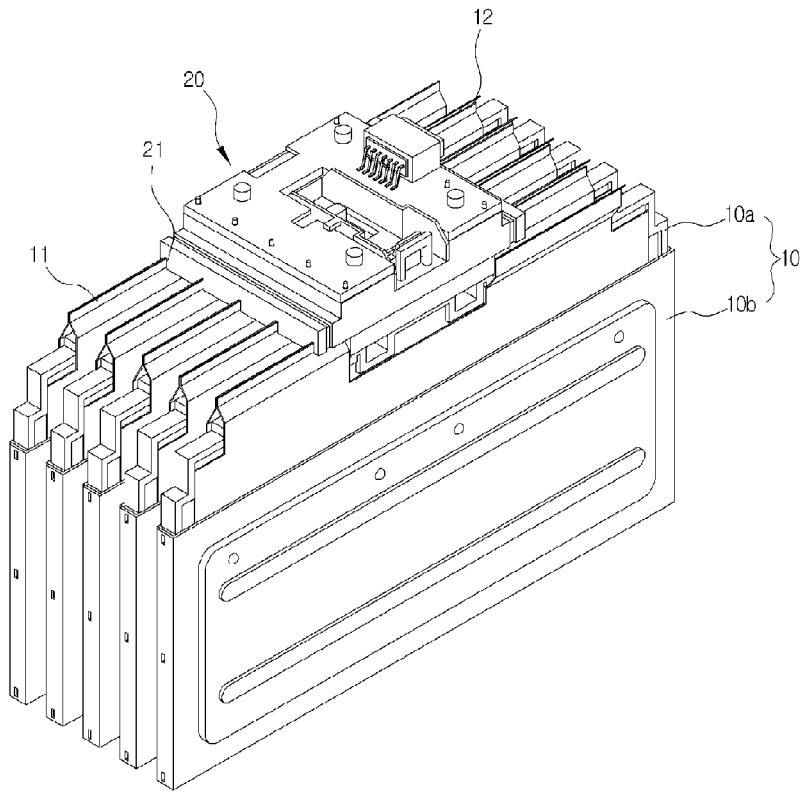
FIG. 1 is a perspective view of battery cells on which a sensing substrate in accordance with an embodiment of the present invention is mounted.

10: battery cell
10a: bare cell
10b: cell case
11: positive electrode
12: negative electrode
20: sensing substrate
21: slot
21a: first slot
21b: second slot
22: terminal
23: temperature sensing bracket
24: substrate fixing lever

BEST MODE FOR CARRYING OUT THE INVENTION

Hereinafter, the embodiments of the present invention will be described in detail with reference to the accompanying drawings.

Prior to describing a sensing substrate in accordance with exemplary embodiments of the present invention, battery cells to which a sensing substrate is applied will be described below.

Figure 2:
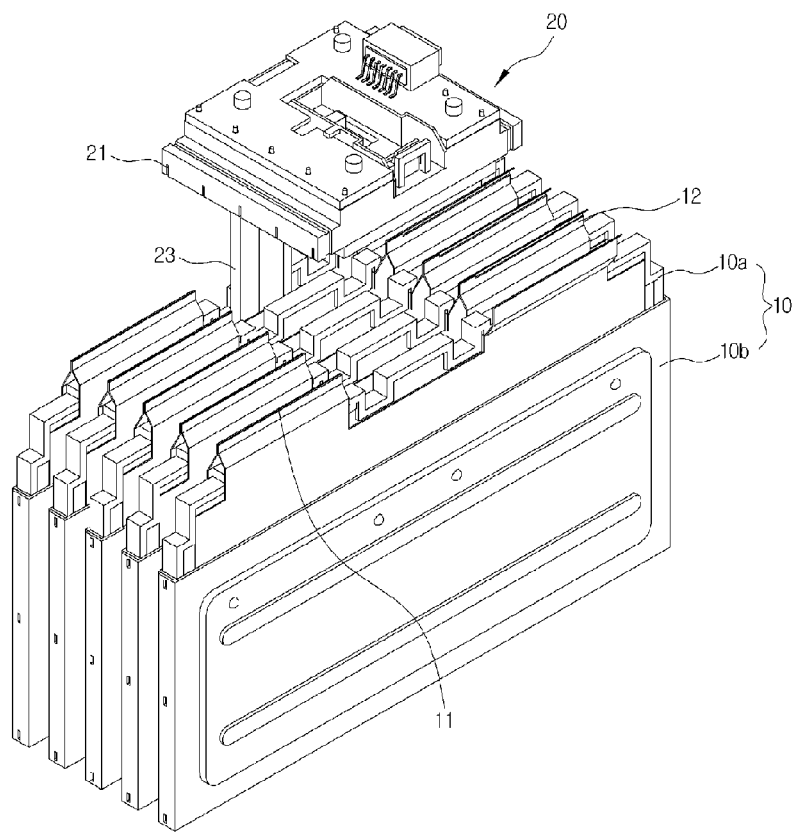
FIG. 2 is an exploded perspective view of FIG. 1.
Figure 3:
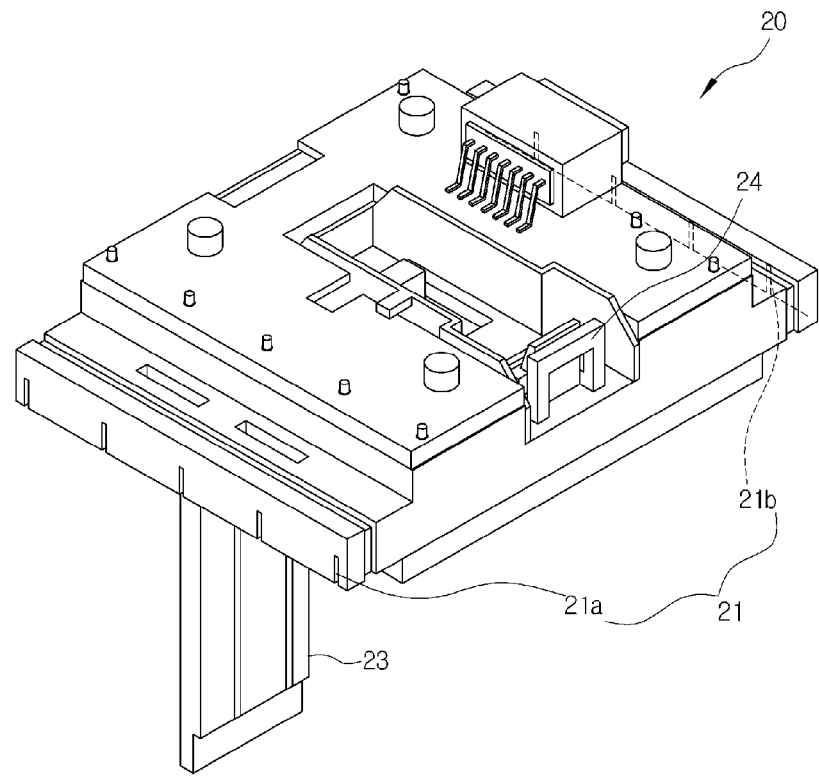
FIG. 3 is a perspective view of the sensing substrate in accordance with an exemplary embodiment of the present invention.

As shown in FIGS. 1 and 2, a battery cell 10 for a secondary battery is configured to include a pouch type bare cell 10a and a cell case 10b in which the bare cell 10a is seated.

The bare cell 10a is formed in a pouch type surrounded by a thin plate aluminum and thus, may be easily broken due to external impact and is stored in the cell case 10b made of a plastic material.

Meanwhile, a leading end of the bare cell 10a is protrudedly provided with positive electrodes 11 and negative electrodes 12, wherein the positive electrodes and the negative electrodes 11 and 12 are made of metals such as copper, aluminum, or the like.

The cell case 10b is injection-molded using nylon, or the like. The reason is that a melting point of nylon is high as 200° C. or more.

A secondary battery is configured using the cell case in accordance with the exemplary embodiment of the present invention and then, is charged and discharged, heat is generated from resistors at terminals connected in series and parallel at the time of charging and discharging the secondary battery with high current. Since temperature generated from a terminal unit is more increased as current is increased, there is a problem in that the cell case is deformed, melted, or the like, due to heat generated from the terminals when the cell case 10b is made of a material having a low melting point. Therefore, the cell case 10b may be preferably made of a heat resistant material.

Hereinafter, an exemplary embodiment of the present invention will be described with reference to the accompanying drawings.

Referring to FIGS. 1 to 5, a sensing substrate 20 in accordance with the exemplary embodiment of the present invention is configured to include slots 21, terminals 22, a temperature sensor bracket 23, and a substrate fixing lever 24. As the sensing substrate 20 in accordance with the exemplary embodiment of the present invention, a general substrate mounted on the battery cells 10 to sense the temperature and voltage of the battery cells 10 is used. The substrate configuration is characterized by connection parts of the positive electrodes and the negative electrodes 11 and 12 that are one of the components of the battery cells 10. A detailed description of a general configuration of the sensing substrate will be omitted and therefore, the connection part will be mainly described. For convenience, the positive electrodes and the negative electrodes are collectively referred to as electrode terminals 11 and 12 below.

A bottom surface of the sensing substrate 20 is provided with the slots 21. The slots 21 are configured to be inserted into the electrode terminals 11 and 12 of the battery cells. The slots 21 are configured to correspond to a width direction of the sensing substrate 20, that is, a length direction of the electrode terminals 11 and 12. The slots 21 are collapsed upwardly from the bottom surface of the sensing substrate 20. A side of the sensing substrate 20 provided with the slots 21 may be formed to be opened.

At least one slot 21 may be spaced apart from each other at a predetermined distance. When the plurality of battery cells are stacked, this is to couple a plurality of battery cells with the sensing substrate 20 at a time by corresponding a plurality of slots 21 to each of the electrode terminals 11 and 12.

Therefore, a spaced distance between the plurality of slots 21 may be preferably set so as to correspond to the spaced distance between the electrode terminals 11 and 12 of the battery cells 10 when the battery cells 10 are stacked.

In this configuration, the electrode terminals 11 and 12 are divided into the positive electrodes 11 and the negative electrodes 12, wherein the positive electrodes 11 and the negative terminals 12 are protruded over the battery cells 10 and are each formed at both sides thereof. When being viewed from a plane, the electrode terminals 11 and 12 are configured so as to be cross each other. The slots 21 have the following configuration so as to correspond thereto.

Figure 5:
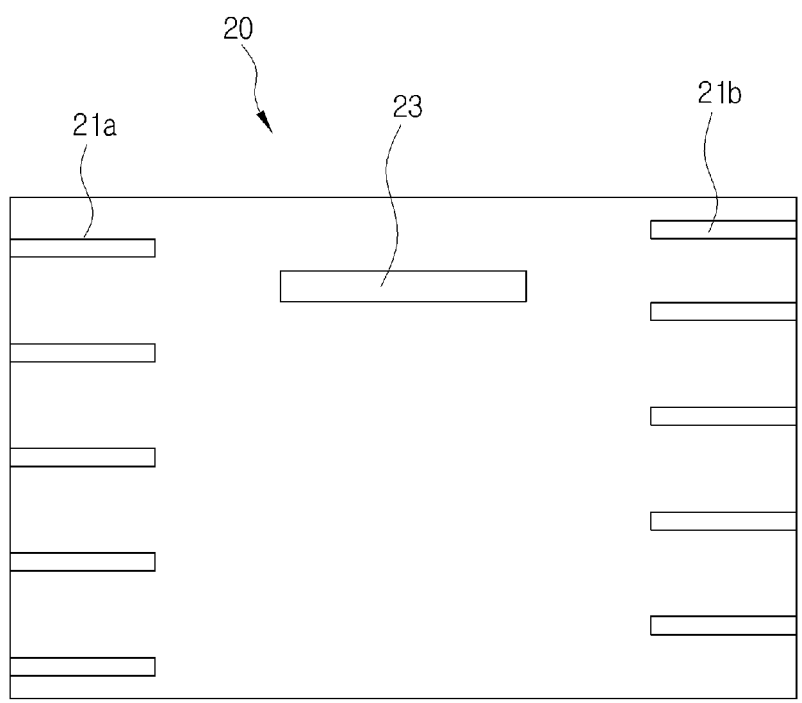
FIG. 5 is a bottom diagram of the sensing substrate in accordance with an exemplary embodiment of the present invention.

Referring to FIG. 5, the slot 21 may be divided into a first slot 21a and a second slot 21b. The first slot 21a is formed at one side of the bottom surface of the sensing substrate 20 and the second slot 21b is formed at the other side of the bottom surface of the sensing substrate 20. In this configuration, the first slot 21a is configured to correspond to the positive electrode 11 and the second slot 21b is configured to correspond to the negative electrode 12. Therefore, the plurality of first slots 21a are configured to cross the second slots 21*b* while being spaced apart from each other at a predetermined distance. Likewise, the plurality of second slots 21*b* are configured to cross the first slot 21*a* while being spaced apart from each other at a predetermined distance.

Figure 4:
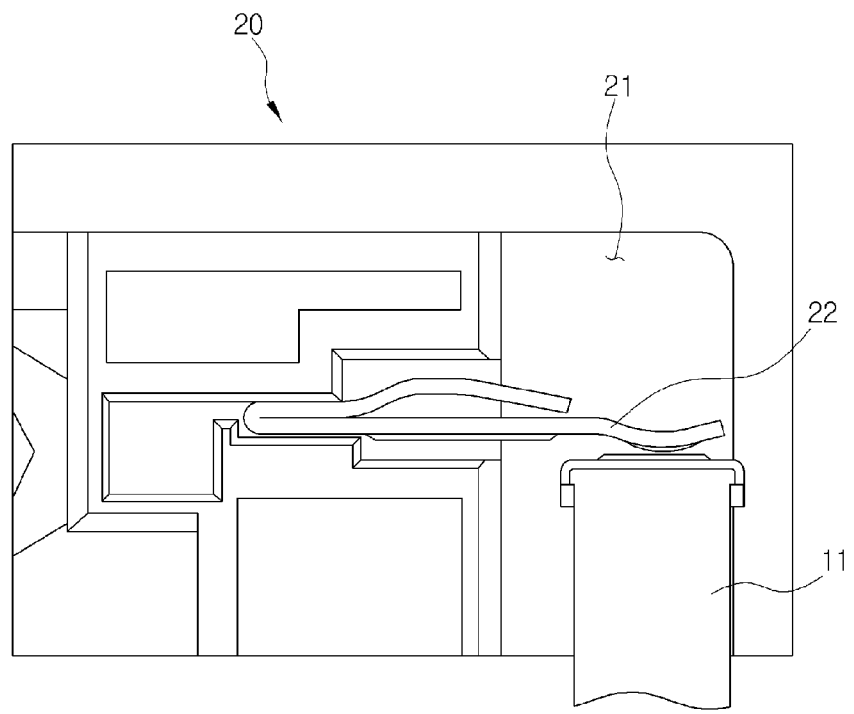
FIG. 4 is a partial cross-sectional view of the sensing substrate in accordance with the present invention.

Referring to FIG. 4, the terminals 22 are configured to be electrically connected with the electrode terminals 11 and 12 of the battery cells 10 and the terminals 22 may be provided in the sensing substrate 20. In more detail, one end of the terminal 22 is fixed to the sensing substrate 20 and the other end thereof is configured to be exposed to a top portion of the slot 21. The bottom surface of the other end of the terminal 22 is configured to contact the top ends of the electrode terminals 11 and 12 when the electrode terminals 11 and 12 are inserted into the slots 21. Therefore, the top ends of the electrode terminals 11 and 12 are configured to be connected with each other by a load applied to the terminals 22 without performing the separate welding working.

A temperature sensor bracket 23 is integrally formed on the sensing substrate 20. Since the temperature sensor bracket 23 is provided with the temperature sensor, the sensing substrate 20 is fixed to the battery cells 10 without performing the temperature sensor fixing working. Therefore, the fixing working of the temperature sensor may be simultaneously performed.

The temperature sensor bracket 23 is extendedly formed downwardly from the bottom surface of the sensing substrate 20. The temperature sensor bracket 23 is vertically formed and is formed to include a space in which the temperature sensor may be received.

The substrate fixing lever 24 is configured to firmly fix the sensing substrate 20 to the electrode terminals 11 and 12. The substrate fixing lever 24 is generally configured to firmly fix the electrode terminals 11 and 12 inserted into the slots and the detailed configuration thereof will be omitted. However, the substrate fixing lever 24 is formed over the sensing substrate 20 and when the substrate fixing lever 24 is pulled, it is easily mounted to separate the sensing substrate 20 from the electrode terminals 11 and 12 and when the substrate fixing lever 24 is pulled into the sensing substrate 20, the sensing substrate 20 and the electrode terminals 11 and 12 can be configured to be firmly fixed to each other.

The exemplary embodiment of the present invention, which is described as above and shown in the drawings, should not be interpreted as limiting the technical spirit of the present invention. The scope of the present invention is limited only by matters set forth in the claims and those skilled in the art can modify and change the technical subjects of the present invention in various forms. Therefore, as long as these improvements and changes are apparent to those skilled in the art, they are included in the protective scope of the present invention.

The invention claimed is:

1. A sensing substrate for sensing voltage and temperature of stacked battery cells each having a positive electrode and a negative electrode exposed to one side of the stacked battery cells, the sensing substrate comprising:
    a slot formed in a bottom surface of the sensing substrate at a position corresponding to a corresponding positive electrode or a corresponding negative electrode, wherein the slot is open towards the one side of the stacked battery cells, and the corresponding positive electrode and the corresponding negative electrode is inserted into the slot when the sensing substrate is mounted on the stacked battery cells; and
    a terminal formed correspondingly to the slot, one end portion of the terminal being fixed to the sensing substrate and the other end portion thereof protruding toward an inner space of the slot, wherein a bottom surface of the other end portion of the terminal is configured to electrically contact with a top end of the corresponding positive electrode or the corresponding negative electrode when the corresponding positive electrode or the corresponding negative electrode is inserted into the slot.

2. The substrate for sensing battery cells of claim 1, wherein the slot includes a plurality of slots formed so as to be spaced apart from each other at a predetermined distance along a length direction of the sensing substrate and the predetermined distance corresponds to a distance between two adjacent battery cells in the stacked battery cells.

3. The substrate for sensing battery cells of claim 1, wherein the slot includes:
    a first slot formed on one side of the bottom surface of the sensing substrate so as to correspond to the positive electrode,
    a second slot formed on the other side of the bottom surface of the sensing substrate so as to correspond to the negative electrode, and
    the first slot and the second slot are formed to cross each other.

4. The substrate for sensing battery cells of claim 1, further comprising a temperature sensor bracket integrally formed with the sensing substrate and extending downwardly from the bottom surface of the sensing substrate.

* * * * *